United States Patent [19]

Ponjee et al.

[11] Patent Number: 4,521,444

[45] Date of Patent: Jun. 4, 1985

[54] METHOD OF PROVIDING A METAL LAYER ON A SUBSTRATE

[75] Inventors: Johannes J. Ponjee; Johan W. A. Nelissen; Christiaan J. A. Verwijlen, all of Eindhoven, Netherlands

[73] Assignee: U.S. Philips Corporation, New York, N.Y.

[21] Appl. No.: 558,402

[22] Filed: Dec. 5, 1983

[30] Foreign Application Priority Data

Dec. 10, 1982 [NL] Netherlands .................... 8204783

[51] Int. Cl.³ ............................................ B05D 3/06
[52] U.S. Cl. ..................................... 427/41; 427/167; 427/250; 427/255.6; 427/255.7
[58] Field of Search ..................... 427/41, 167, 255.7, 427/255.6, 250; 428/216

[56] References Cited

U.S. PATENT DOCUMENTS 4,315,970 2/1982 McGee ........................ 427/167 X

FOREIGN PATENT DOCUMENTS 2070070A 9/1981 United Kingdom .

Primary Examiner—Evan K. Lawrence
Attorney, Agent, or Firm—Norman N. Spain

[57] ABSTRACT

A method of providing a metal layer on a substrate having an ultra-smooth or microprofiled surface, in which the surface structure is reproduced in the metal layer. On the substrate surface which is hydrophilic or is made hydrophilic, preferably a monomolecular layer of alkoxysilylalkylthiol, an alkoxysilylalkylamine or a chlorosilylalkylthiol is provided as a bonding intermediary in a layer which is at most 15 molecules thick by contact with an atmosphere in which said substance is present in a vapor form. The metal layer is vapor-deposited thereon in a thickness of 50–300 nm.

4 Claims, No Drawings

METHOD OF PROVIDING A METAL LAYER ON A SUBSTRATE

The invention relates to a method of providing a metal layer on a substrate by bonding the metal layer to the substrate by means of a bonding intermediary.

Such a method is known from published GB Patent Application Specification No. 20 70 070A in which an alkoxysilylalkylthiol, an alkoxysilylalkylamine or a chlorosilylalkylthiol serves as a bonding intermediary. The silicon side of the molecule of said bonding intermediary adheres to the substrate on one side. As a result of this the sulphur group or the amine group, respectively, become located on the outside so that a good bonding with metals is obtained.

The boundary intermediary is applied by dipping or spraying, as such or in the form of a solution. If desired, a basic layer on the basis of a polysiloxane is provided prior to providing the bonding intermediary.

However, there exists a need for means for binding a thin metal layer on a substrate in an accurate manner, the surface of which substrate is ultra-smooth or is microprofiled and in which the surface finish or profile after providing the metal layer is maintained. An example of such a microprofile is a digital information pattern in the form of pits having areas of the order of 1 $\mu m^2$ with an accuracy of 0.1 $\mu m^2$.

This accuracy cannot be achieved when the silane bonding as an intermediary is applied in a conventional manner.

According to the invention, the method of providing a metal layer on a substrate so as to obtain a reproducible ultra-smooth or microprofiled substrate surface on the metal layer is characterized in that the bonding intermediary is provided as a monomer in a layer which is at most 15 molecules thick on a surface of the substrate which is hydrophilic or is made hydrophilic, by contacting the substrate surface with an atmosphere in which the bonding intermediary is present in vapor form and that the metal layer is then provided thereon by vapor deposition in a thickness from 50–300 nm.

The layer of the bonding intermediary is preferably provided as a monomolecular layer.

The surface of the substrate upon which the method can be carried out successfully must be hydrophilic or must be made hydrophilic so as to produce a good bonding to the alkoxylated silane groups.

A substrate of glass, quartz or silicon which is always covered with a natural oxidic skin already has a sufficient number of free OH groups on the surface to bind the alkoxylated silane groups, while splitting off alkanol. Most synthetic resins in themselves are not hydrophilic but can be made hydrophilic by means of an oxidizing pre-treatment. A very suitable oxidizing treatment, to which, for example, polymethylmethacrylate can be subjected and which attacks the surface so slightly that the profile is maintained, is a glow discharge in an oxygen-rich atmosphere. A polycarbonate can be made hydrophilic by a treatment with a diluted mixture of bichromate and sulphuric acid solution.

An interesting possibility of the use of the instant invention is making a mirror having an ultra smooth surface. The starting material is an aluminum substrate whose surface has been smoothed by conventional treatment, for example on a normal lathe, and hence, microscopically, has a rather high roughness. By means of a quartz jig whose surface has an ultra-smooth profile, the surface is filled in the valleys by means of a synthetic resin, for example an acrylate, is made to polymerize by means of ultraviolet radiation, and in this manner is given the same high degree of smoothness. The substrate is then subjected to an oxidizing pre-treatment, for example, by means of the above-mentioned glow discharge in an oxygen atmosphere. As a result of this the synthetic resin parts of the surface are oxidized and cleaning thereof also takes place. After providing the bonding intermediary in the manner already described, a thin layer of silver or gold is provided. This latter is carried out by vapor deposition.

Such a mirror is used, for example in an infrared night telescope.

The thickness of the metal layer to be provided by vapor deposition depends on the particular embodiment. Upon metallizing the abovementioned digital information pattern, a layer of 50–100 nm is vapor-deposited. Upon metallizing an ultra-smooth surface, the layer may be thicker—up to 300 nm.

EXAMPLE 1

A 20 $\mu m$ thick layer of the monomer, 4,4-isopropylidenephenol-di-(ethyleneglycolmethacrylate) ether, to which the photo-initiator benzyldimethylketal has been added in a quantity of 4% by weight is provided on a quarz matrix by pouring.

The layer is then photopolymerised by exposure through the quartz matrix to a Philips TL-009 tube. The exposed layer is bonded by a commercially available adhesive to an aluminum substrate and the assembly is then detached from the matrix. As a result of this the substrate comprises a coating of synthetic resin the profile of which in the surface is an exact negative of the matrix.

The hydrophobic synthetic resin surface is then made hydrophilic by means of a glow discharge in an oxygen plasma for 30 minutes with an operating voltage of 3–4 kV.

The article is then placed at ambient temperature in a dessicator in which a dish with 3-mercaptopropyltrimethoxysilane (trimethoxysilylpropylthiol-3) has been placed and a pressure of 10 cm Hg has been adjusted. The partial vapor pressure of the 3-mercaptopropyltrimethoxysilane is sufficient to react with the hydrophilic surface of the article. After a stay of 20 hours in the dessicator, resulting in a monomolecular layer of the compound being deposited, the article is removed therefrom and a 0.05–0.3 $\mu m$ thick layer of gold is provided in known manner by vapor deposition.

The bonding of the gold layer to the synthetic resin surface is evaluated using the so-called "diamond-scratching method" (DIN 53.151) as follows.

12 lines are scratched through the metal layer. The pattern of lines consists of 6 parallel lines at a mutual distance of 1 mm which are crossed at right angles by also 6 parallel lines at a mutual distance of 1 mm so that the scratched pattern comprises 25 square areas of 1 $mm^2$. An adhesive strip of "Tesafilm" is pressed on the pattern and is then pulled off the surface. The level of the bonding is indicated by means of the following evaluation figures, in which 0 = optimum bonding: 0 squares are pulled off the surface 1 = good bonding: 1–5 squares work loose 2 = reasonable bonding: 6–10 squares work loose 3 = insufficient bonding: 11–15 squares work loose 4 = bad bonding: 16–20 squares work loose 5=no bonding: 21-25 squares work loose.

The bonding of the gold layer to the synthetic resin surface according to this example may be qualified by the evaluation figure 0 (optimum bonding).

EXAMPLE 2

The method used in Example 1 is the same as that of this example with the exception that instead of gold, silver is provided on the substrate comprising the polymer layer and the bonding intermediary provided thereon.

The bonding according to the above-described DIN 53.151 test can also be qualified by the evaluation figure 0.

EXAMPLE 3

A surface layer of a silicon wafer was converted into $SiO_2$ and this $SiO_2$ layer was made hydrophilic by means of a glow discharge in the manner as described in Example 1 and is provided with a monomolecular layer of 3-mercaptopropyltrimethoxysilane in the same manner as in said Example. A layer of gold or silver is then vapor-deposited thereon in a thickness of 0.05–0.3 μm and has a bonding with an evaluation figure 0 according to DIN 53.151.

As a bonding intermediary may be used with the same result 3-amonipropyltrimethoxysilane (trimethoxysilylpropylamine-3) or 3-mercaptopropyltrichlorosilane (trichlorosilylpropyl 3-thiol).

The resulting optimum bonding of the noble metal to the silicon wafer is maintained after the metallized wafer has been tested by staying a fortnight at a temperature of 170° C. The great difference in coefficients of expansion between the Si and the noble metal is thus accomodated in the bonding layer applied by a method according to the invention.

What is claimed is:

1. A method of providing a metal layer on a hydrophilic surface of a substrate by means of a bonding intermediary selected from the group consisting of alkoxysilylalkylthiols, alkoxysilylalkylamines and chlorosilylalkylthiols comprising exposing said surface of said substrate with an atmosphere in which said bonding intermediary is present in vapor form until a monomer layer of said intermediary of a thickness of at most 15 molecules is formed on said hydrophilic surface and providing, by vapor deposition a metal layer of a thickness of 50–300 nm on the exposed surface of the resultant layer of said intermediary.

2. A method as claimed in claim 1 characterized in that said bonding intermediary is provided in a monomolecular layer.

3. A method of claim 1 characterized in that prior to exposure to the bonding intermediary, the substrate surface is rendered hydrophilic by being exposed to a glow discharge in an oxidizing atmosphere.

4. A method of claim 2 characterized in that prior to exposure to the bonding intermediary, the substrate surface is rendered hydrophilic by being exposed to a glow discharge in an oxidizing atmosphere.

* * * * *

UNITED STATES PATENT AND TRADEMARK OFFICE
CERTIFICATE OF CORRECTION

PATENT NO. : 4,521,444

DATED : June 4, 1985

INVENTOR(S) : JOHANNES J. PONJEE ET AL

It is certified that error appears in the above-identified patent and that said Letters Patent is hereby corrected as shown below:

In the Claims:

Column 4, line 12, change "with" to --to--;

line 16, change "deposition" to --deposition,--;

lines 22 and 26, change "A" to --The--.

Signed and Sealed this

Twenty-third Day of September 1986

[SEAL]

Attest:

DONALD J. QUIGG

Attesting Officer

Commissioner of Patents and Trademarks